United States Patent
Saito

(10) Patent No.: US 10,083,953 B2
(45) Date of Patent: Sep. 25, 2018

(54) SEMICONDUCTOR DEVICE, CONTROL IC FOR SWITCHING POWER SUPPLY, AND SWITCHING POWER SUPPLY UNIT

(71) Applicant: FUJI ELECTRIC CO., LTD., Kawasaki-shi (JP)

(72) Inventor: Masaru Saito, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/591,362

(22) Filed: Jan. 7, 2015

(65) Prior Publication Data
US 2015/0228641 A1   Aug. 13, 2015

(30) Foreign Application Priority Data
Feb. 10, 2014   (JP) .................. 2014-023815

(51) Int. Cl.
H01L 29/66   (2006.01)
H01L 27/06   (2006.01)
H01L 29/735   (2006.01)
H01L 29/808   (2006.01)
H01L 29/06   (2006.01)
(Continued)

(52) U.S. Cl.
CPC ...... *H01L 27/0623* (2013.01); *H01L 29/0692* (2013.01); *H01L 29/735* (2013.01); *H01L 29/808* (2013.01); *H01L 27/098* (2013.01); *H01L 29/0808* (2013.01); *H01L 29/41708* (2013.01)

(58) Field of Classification Search
CPC ............. H01L 27/0623; H01L 29/0692; H01L 29/1095; H01L 29/735; H01L 27/098; H01L 29/0808; H01L 29/41708; H01L 29/808

USPC ........................................................ 257/337
See application file for complete search history.

(56) References Cited

U.S. PATENT DOCUMENTS 5,065,213 A * 11/1991 Frisina ................ H01L 27/0716
257/335
7,306,999 B2   12/2007 Hall et al.
(Continued)

FOREIGN PATENT DOCUMENTS

JP      2008153636 A    7/2008

*Primary Examiner* — Duy T Nguyen
(74) *Attorney, Agent, or Firm* — Rossi, Kimms & McDowell LLP

(57) ABSTRACT

Aspects of the invention can include a semiconductor device, control IC for switching power supply and switching power supply unit, which allow input voltage detecting function to be realized without resistor-voltage dividing circuit. An npn-type element consisting of p-type region, collector region and emitter region is included inside of drain region of starting element. On a first interlayer insulating film, aspects of the invention can provide collector electrode wiring of npn-type element, emitter-drain electrode wiring serving as both emitter electrode wiring of npn-type electrode and drain electrode wiring of starting element, source electrode wiring of starting element, and gate electrode wiring of starting element. A first metal wiring can serve both as input terminal of starting element and input terminal of npn-type element is connected to collector electrode wiring. The npn-type element can function as input voltage detecting means for detecting input voltage drop applied to the first wiring.

10 Claims, 9 Drawing Sheets

(51) Int. Cl.
*H01L 27/098* (2006.01)
*H01L 29/417* (2006.01)
*H01L 29/08* (2006.01)

(56) References Cited

U.S. PATENT DOCUMENTS

| | | | | |
|---|---|---|---|---|
| 7,755,139 | B2 * | 7/2010 | Ronsisvalle | H01L 29/66378 |
| | | | | 257/328 |
| 2008/0117653 | A1 | 5/2008 | Saito | |
| 2012/0039096 | A1 * | 2/2012 | Dunipace | H02M 1/36 |
| | | | | 363/21.12 |
| 2012/0301172 | A1 * | 11/2012 | Odate | G03G 15/80 |
| | | | | 399/88 |
| 2013/0187695 | A1 * | 7/2013 | Koehler | H03K 17/0828 |
| | | | | 327/170 |
| 2014/0027817 | A1 * | 1/2014 | Trivedi | H01L 27/0623 |
| | | | | 257/192 |

* cited by examiner

SEMICONDUCTOR DEVICE, CONTROL IC FOR SWITCHING POWER SUPPLY, AND SWITCHING POWER SUPPLY UNIT

CROSS-REFERENCE TO RELATED APPLICATION

This application is based on, and claims priority to, Japanese Patent Application No. 2014-023815, filed on Feb. 10, 2014. The disclosure of the priority application, in its entirety, including the drawings, claims, and the specification thereof, is incorporated herein by reference.

BACKGROUND OF THE INVENTION

1. Field of the Invention

Aspects of the invention relate to semiconductor devices, and control ICs for switching power supplies.

2. Description of the Related Art

A control IC for switching power supply is a special IC for controlling individual high breakdown voltage switching transistors. This IC forms a power supply for itself by operating a high-breakdown-voltage switching transistor in an operating state, whereas requires provided with a starting current from a starting circuit at startup. Usually, a starting circuit is integrated on the same semiconductor substrate as a control IC for switching power supply, thereby it is realized to reduce a parts count and to simplify a power supply system.

Starting current is made by rectifying input alternating current signal (AC 100 to 200V), and normally-on type element upstream from starting circuit requires high breakdown voltage of more than 450V, for supplying the starting current to starting circuit. This normally-on type element is made monolithic with control IC for switching power supply, so that it is implemented to a lateral high-breakdown-voltage field effect junction transistor (field effect junction transistor: JFET). Design specifications of switching power supply unit are decided by current driving capability of the element.

When a plug of a switching power supply unit is pulled off the outlet and voltage supply from AC input becomes to be stopped, input voltage of primary side decreases. When the switching power supply unit continues to work in this condition, on-time state of MOSFET (Insulated gate field effect transistor) functioning as switching element gets longer and MOSFET generates heat. To prevent this problem, for switching power supply unit, a brown-out function is provided that stops switching action of power supply when input voltage has decreased.

For realizing the brown-out function, a conventional switching power-supply unit is divided broadly into an external resistor-voltage dividing system or an incorporated IC chip system. External resistor-voltage dividing system means that primary side voltage of power supply is resistor-voltage divided by resistor-voltage dividing circuit connecting two resistors in series externally mounted to control IC for switching power supply (hereinafter referred to as "control IC"). Incorporated IC chip system means that primary side voltage of power supply is resistor-voltage divided by high-breakdown-voltage dividing resistor incorporated in control IC. In an incorporated IC chip system, high-breakdown-voltage dividing resistor (resistor element) is constituted by using voltage resistant structure of high-breakdown-voltage device (starting element).

A switching power supply unit for incorporated IC chip system is proposed that arranges spiral resistor on voltage resistant structure of existing starting element constituting starting circuit in control IC, to realize high-breakdown-voltage dividing resistor. See, for example, Japanese Unexamined Patent Application Publication No. 2008-153636 (also referred to herein as "Patent Document 1"). In the above Patent Document 1, resistors are placed into the spiral along the periphery of starting element, from drain electrode with maximum potential disposed at the center of starting element to source region and gate region surrounding the periphery of drain region so that electric potential falls gradually. Thus resistors are integrated with starting element to allow switching power supply unit to incorporate high breakdown voltage resistor element without providing high breakdown voltage structure newly.

However, when input voltage detecting means adopts resistor voltage dividing circuit with two resistors connected in series, current consumption is always generated in resistor voltage dividing circuit while input voltage is applied. This kind of problem occurs whether resistor voltage dividing circuit is incorporated or externally mounted to semiconductor integrated circuit device. Usually, elevating resistance value of entire resistor voltage dividing circuit suppresses current consumption. However, when incorporating resistor-voltage dividing circuit in semiconductor integrated circuit (IC), the following two problems occur.

The first problem is that starting element is made wide in area and large in size in order to ensure the length of resistor constituting resistor-voltage dividing circuit. The second problem is that variation of resistance value increases because of further lowering impurity dope amount of resistor in order to elevate resistance value of resistor per unit length. Addition of adjusting circuit such as trimming is publicly known as a method to solve these two problems, which has a problem that circuit constitution is made complicated.

SUMMARY OF THE INVENTION

Aspects of the present invention to provide a semiconductor device, a control IC for switching power supply and a switching power supply unit which allow input voltage detecting function to be realized without using resistor-voltage dividing circuit, in order to eliminate the problem according to the conventional technology mentioned above.

In order to address the above-mentioned problems, a semiconductor device related to the invention has the following characteristics. The semiconductor device comprises a field effect transistor having a drift region of a second conductivity type formed in a surface layer of a semiconductor substrate of a first conductivity type and a drain region of the second conductivity type formed in the surface layer of the semiconductor substrate in contact with the drift region. A semiconductor region of the first conductivity type is selectively formed in a surface layer of the drain region. A first semiconductor region of a second conductivity type is selectively formed in a surface layer of the semiconductor region of the first conductivity type. The second semiconductor region of the second conductivity type is selectively formed in the surface layer of the semiconductor region of the first conductivity type apart from the first semiconductor region of the second conductivity type. A first electrode wiring is disposed to be connected to the first semiconductor region of the second conductivity type. Input voltage is externally inputted into the first electrode wiring. A second electrode wiring is disposed to be connected to the drain region and the second semiconductor region of the second conductivity type.

In addition, a semiconductor device related to aspects of the invention further has the following characteristics in the above-mentioned invention. The field effect transistor includes a channel region of the first conductivity type, a source region of the second conductivity type, a control electrode, a third electrode wiring, and a fourth electrode wiring. The channel region is selectively formed in the surface layer of the semiconductor substrate in contact with the drift region. The source region is formed in the surface layer of the semiconductor substrate in contact with the channel region and faces the drain region across the drift region. The control electrode is connected to the channel region. The third electrode wiring is connected to the source region. The fourth electrode wiring is connected to the channel region and the control electrode.

In addition, a semiconductor device related to aspects of the invention further has the following characteristics in the above-mentioned invention. The field effect transistor includes a channel region of the first conductivity type, a source region of the second conductivity type, a control electrode, and a third electrode wiring. The channel region is selectively formed in the surface layer of the semiconductor substrate in contact with the drift region and faces the drain region across the drift region. The source region is selectively formed in the surface of the channel region. The control electrode is formed through an insulating film on the surface of a portion of the channel region, which is sandwiched between the drift region and the source region. The third electrode wiring is connected to the channel region and the source region.

Further, the control IC for switching power supply related to aspects of the invention is characterized by including the starting circuit containing the above-mentioned semiconductor device.

In addition, in to address the above-mentioned and other problems, the control IC for switching power supply related to the invention comprises a starting circuit including a field effect transistor and a bipolar transistor, and has the following characteristics. The field effect transistor is externally applied with primary side voltage to a drain terminal, and grounded with a gate terminal. The field effect transistor outputs a signal to control a switching transistor through a source terminal. The bipolar transistor is integrated in the identical semiconductor substrate with the field effect transistor and also in a drain region of the field effect transistor. And the bipolar transistor makes the field effect transistor operate by conducting when primary side voltage applied to a drain terminal of the field effect transistor is greater than prescribed voltage.

Further, in order to address the above-mentioned and other problems, the switching power supply unit related to the invention is characterized by having the above-mentioned control IC for switching power supply.

In accordance with aspects of the above-mentioned invention, by connecting bipolar transistor in series between input terminal applied with input voltage and drain of field effect transistor, it is possible that current is not sent to field effect transistor in case of applied input voltage less than breakdown beginning voltages for bipolar transistor, but current is sent to field effect transistor in case of applied input voltage not less than breakdown beginning voltages for bipolar transistor. By this current variation, input voltage drop can be detected without using resistor-voltage dividing circuit.

In accordance with certain aspects of the invention, an effectiveness is obtained that input voltage detecting function can be implemented without using a resistor-voltage dividing circuit.

DETAILED DESCRIPTION

Some embodiments of semiconductor device, control IC for switching power supply and switching power supply unit related to the invention will be described specifically with reference to the accompanying drawings below. In the present specification and the accompanying drawings, layers and regions to which n or p is prefixed mean that electron or hole is majority carrier therein respectively. In addition, the symbol of + or − added to n and p means that impurity concentration is respectively higher or lower than layer and region to which the sign is not added. In the description and the accompanying drawings of embodiments below, the same symbols are assigned for the similar configuration, and duplicated descriptions are omitted.

First Embodiment

Figure 1:
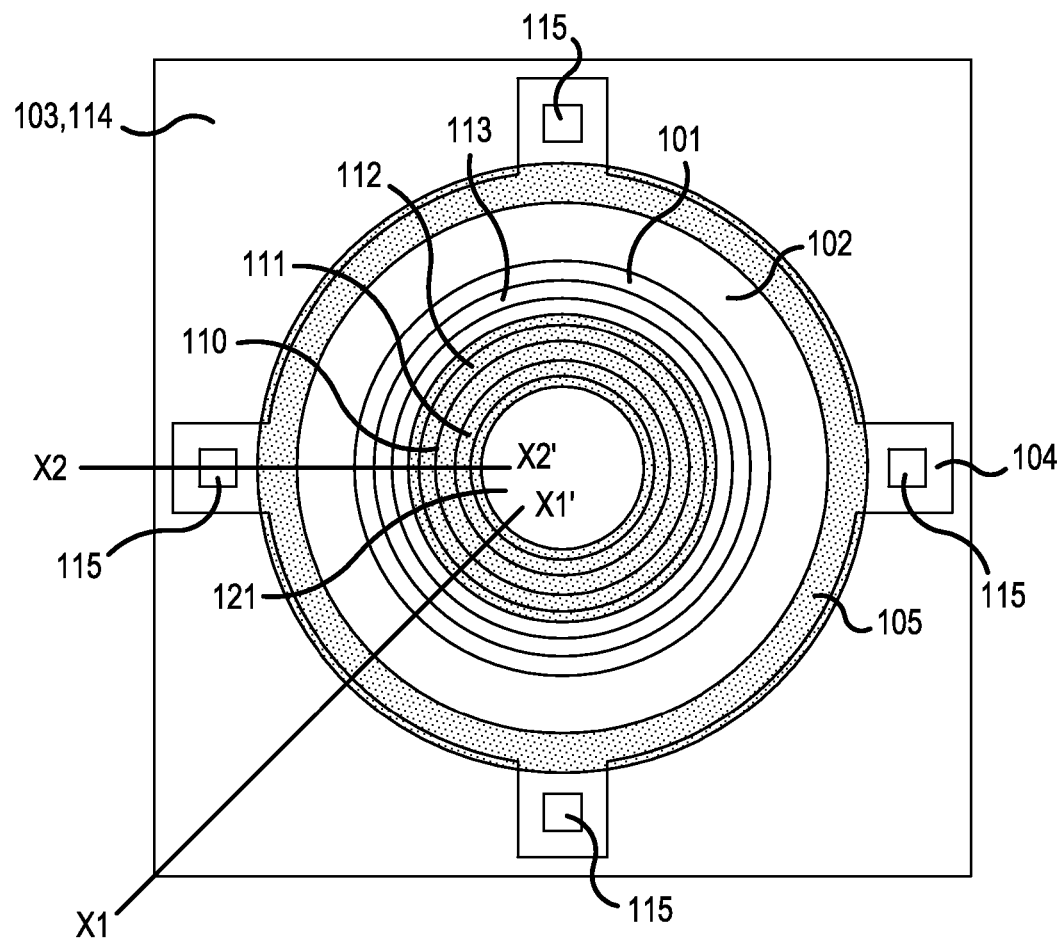
FIG. 1 is a plane view showing a principal part of semiconductor device related to a first embodiment of the invention.
Figure 2:
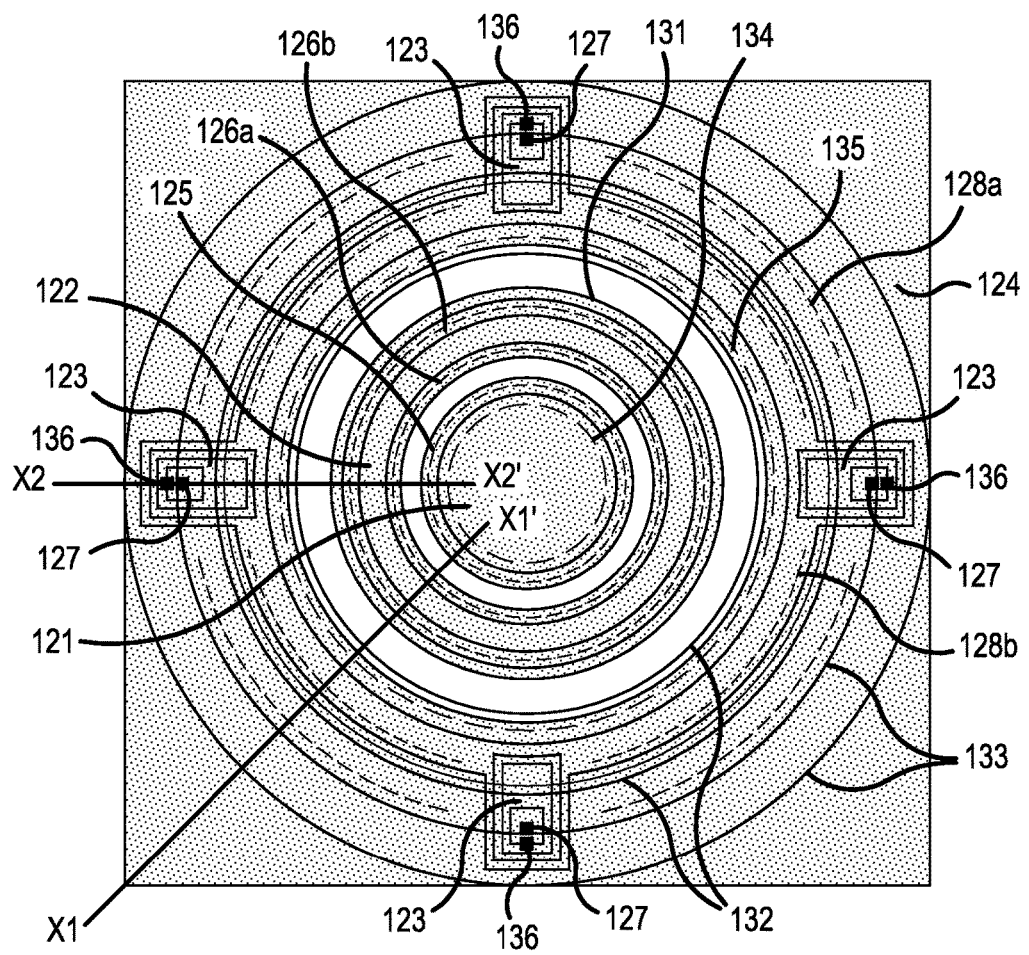
FIG. 2 is a plane view showing a principal part of semiconductor device related to a first embodiment of the invention.
Figure 3:
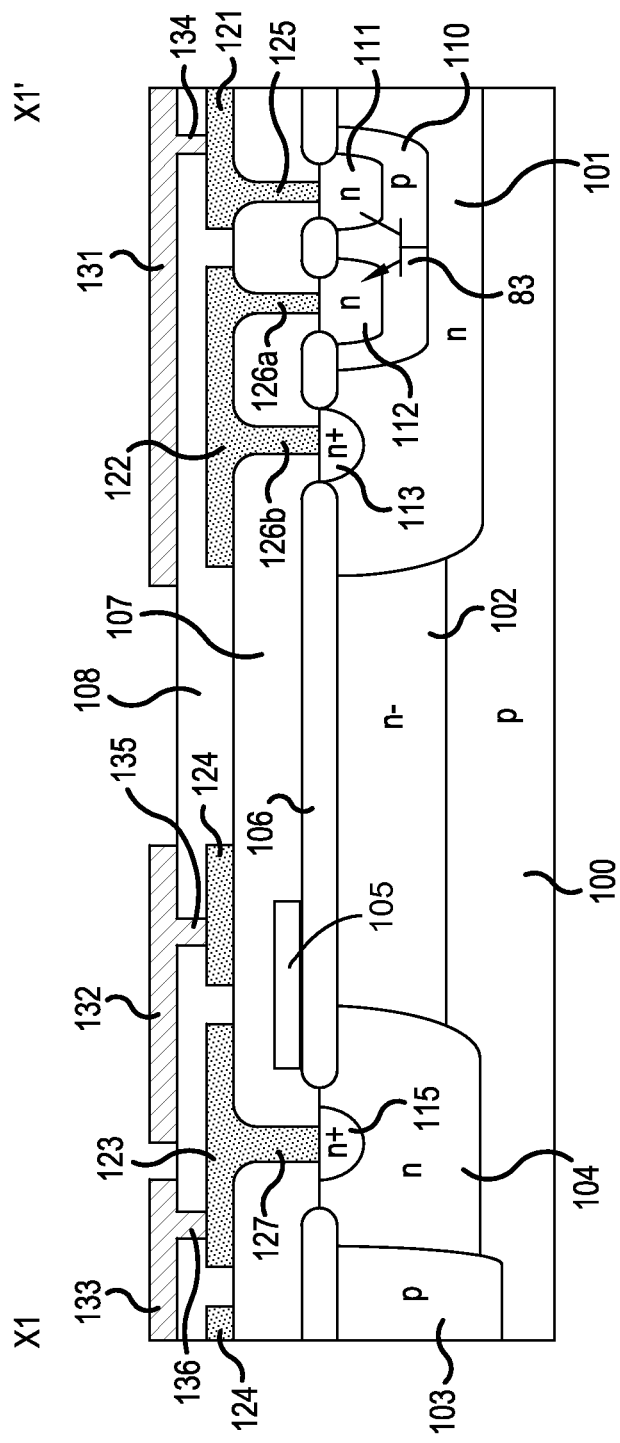
FIG. 3 is a cross-sectional view of semiconductor device taken along the section line X1-X1' of FIG. 1 and FIG. 2.
Figure 4:
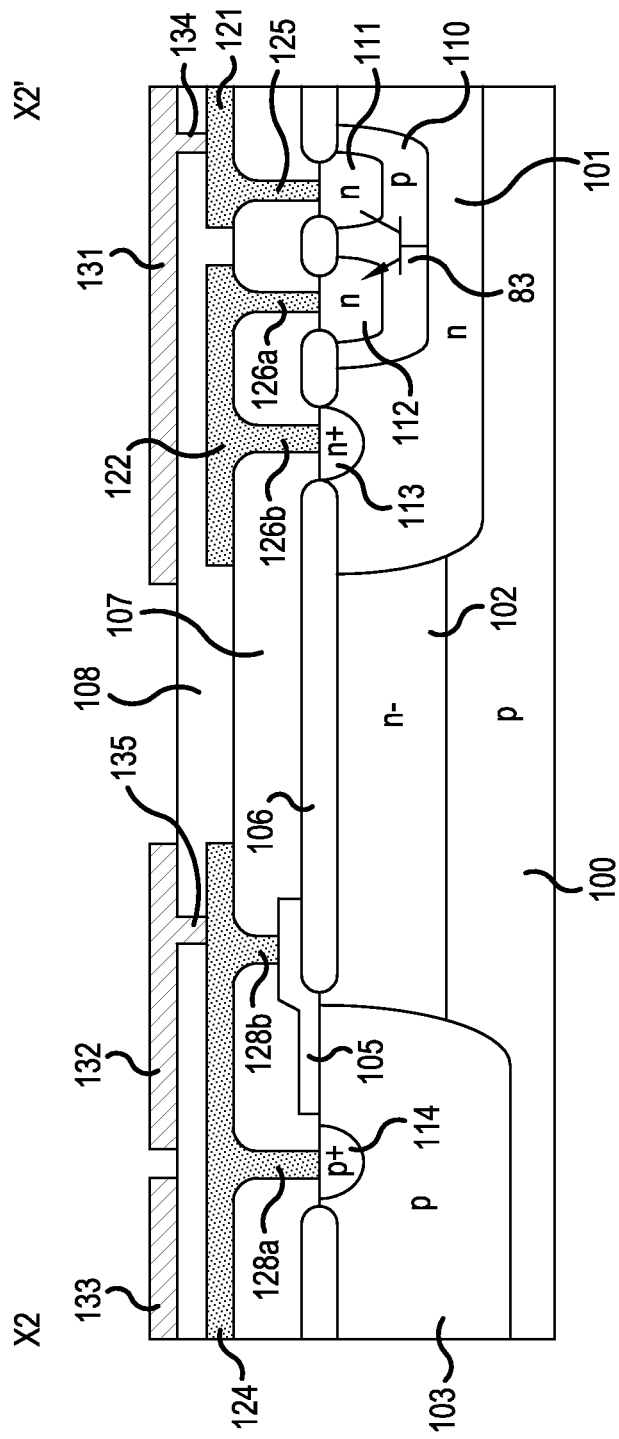
FIG. 4 is a cross-sectional view of semiconductor device taken along the section line X2-X2' of FIG. 1 and FIG. 2.

Configuration of semiconductor device related to a first embodiment will be described. FIG. 1 and FIG. 2 are a plane view showing a principal part of semiconductor device related to a first embodiment of the invention. In addition, FIG. 3 is a cross-sectional view of semiconductor device taken along the section line X1-X1' of FIG. 1 and FIG. 2. FIG. 4 is a cross-sectional view of semiconductor device taken along the section line X2-X2' of FIG. 1 and FIG. 2. FIG. 1 shows a lower layer structure including impurity diffusion regions inside of semiconductor substrate and polysilicon layers on semiconductor substrate. FIG. 2 shows an upper layer structure including interlayer insulating film on semiconductor substrate, contact and metal wiring, continued from FIG. 1. This semiconductor device constitutes a starting element of starting circuit incorporated into control IC for switching power supply (hereinafter referred to as "control IC"). Here, starting element including JFET is described as an example.

As shown in FIGS. 1 to 4, in the surface layer of p-type substrate (semiconductor substrate) 100, p-type well region is selectively disposed to become gate region 103. Gate region 103 is peripheral region surrounding active region and has the same potential as p-type substrate 100. The active region gets electric current when in on-state. The peripheral region has a function to attenuate electric field of drift region 102 and to maintain voltage breakdown resistance. Further, in the surface layer of p-type substrate 100, n⁻-type well region of lower impurity concentration is disposed inside of gate region 103, which provides drift region 102 of lower impurity concentration for forming depression region.

Drift region 102 is selectively disposed so as to get into a part of gate region 103 with prescribed width. N-type region of high impurity concentration to be source region 104 is disposed in the portion, of drift region 102, which gets into gate region 103. Source region 104 might be fully disposed in the portion of drift region 102, which gets into gate region 103. Further, in the surface layer of p-type substrate 100, n-type well region to be drain region 101 is disposed, facing source region 104, also at the portion apart from source region 104.

Specifically, drain region 101 is disposed so as to come in contact with drift region 102, on the surface layer of p-type substrate 100, in the central portion of drift region 102. When a plurality of JFETs is disposed on the identical semiconductor substrate, drain region 101 is common to a plurality of JFETs. Source region 104 is located on the circumference spaced equally apart from drain region 101. Drain region 101 and source region 104 might be simultaneously formed by ion implantation and diffusion through the identical mask. The depth of drain region 101 and source region 104 might be greater than that of drift region 102.

At the place where drift region 102 comes in contact with gate region 103, gate polysilicon electrode 105 consisting of polysilicon layer for example is disposed, so as to surround drain region 101 and also to straddle gate region 103 and drift region 102. Gate polysilicon electrode 105 functions as a field plate. At the place formed with source region 104, gate polysilicon electrode 105 is disposed on LOCOS oxide film 106 over drift region 102. First interlayer insulating film 107 is disposed on LOCOS oxide film 106, gate polysilicon electrode 105, gate region 103, source region 104, and drain region 101.

In the inside of drain region 101, npn-type element (npn-type bipolar transistor) 83 is disposed as input-voltage detecting means for detecting input voltage drop. Specifically, in the surface layer of substrate face side in drain region 101, p-type region (semiconductor region of the first conductivity type) 110 functioning as base region of npn-type element 83 is selectively disposed. Surface layer of substrate face side in p-type region 110 selectively disposes thereon n-type region functioning as collector region (first semiconductor region of the second conductivity type) 111 of npn-type element 83 and n-type region functioning as emitter region (second semiconductor region of second conductivity type) 112 of npn-type element 83, apart from each other. That is, npn-type element 83 is integrally provided on the identical semiconductor substrate (chip) with starting element.

First interlayer insulating film 107 disposes thereon metal wiring to be collector electrode wiring (first electrode wiring) 121 of npn-type element 83, metal wiring 122 serving both as emitter electrode wiring of npn-type element 83 and drain electrode wiring of starting element (hereinafter referred to as "emitter-drain electrode wiring": second electrode wiring), metal wiring to be source electrode wiring (third electrode wiring) 123, and metal wiring to be gate electrode wiring (fourth electrode wiring) 124 of starting element (shown as light hatching part). Collector electrode wiring 121 is disposed on drain region 101 and has planar shape such as nearly round shape. Collector electrode wiring 121 is connected to collector region 111 of npn-type element 83, through collector contact part 125 penetrating first interlayer insulating film 107.

Emitter-drain electrode wiring 122 is disposed on emitter region 112 and drain region 101 so as to surround collector electrode wiring 121. Emitter-drain electrode wiring 122 is electrically connected to emitter region 112 and drain region 101, through emitter contact part 126a and drain contact part 126b penetrating first interlayer insulating film 107. That is, emitter region 112 of npn-type element 83 is electrically connected to drain region 101 of starting element by emitter-drain electrode wiring 122. N⁺-type high concentration region 113 may be disposed at the contact point to drain contact part 126b in the inside of drain region 101.

Source electrode wiring 123 is disposed on source region 104 so as to surround emitter-drain electrode wiring 122. Source electrode wiring 123 is electrically connected to source region 104, through source contact part 127 penetrating first interlayer insulating film 107. N⁺-type high concentration region 115 may be disposed at the contact point to source contact part 127 in the inside of source region 104. Gate electrode wiring 124 is disposed on gate region 103, so as to surround drain region 101, drift region 102 and source region 104. Gate electrode wiring 124 is electrically connected to gate region 103 and gate polysilicon electrode 105, through gate contact part 128a and polysilicon contact part 128b penetrating first interlayer insulating film 107. P⁺-type high concentration region 114 may be disposed at the contact point to gate contact part 128a inside of gate region 103.

Second interlayer insulating film 108 is disposed on collector electrode wiring 121, emitter-drain electrode wiring 122, source electrode wiring 123, and gate electrode wiring 124. Second interlayer film 108 includes thereon first metal wiring (first electrode wiring) 131 connected to VH terminal of starting circuit (high breakdown voltage input terminal), second metal wiring of substrate potential (fourth electrode wiring) 132, and third metal wiring (third electrode wiring) 133 connected to BO terminal of starting circuit (brown-out input terminal). An embodiment of starting circuit constitution is mentioned later. In FIG. 2, a section sandwiched between two circles with reference numeral 132 is second metal wiring 132, and a section sandwiched between two circles with reference numeral 133 is third metal wiring 133.

First metal wiring 131 has planar shape such as nearly circular shape and is disposed on collector metal wiring 121 and emitter-drain electrode wiring 122. First metal wiring 131 is electrically connected to collector electrode wiring 121 through a via 134 penetrating second interlayer insulating film 108, and is electrically connected to collector region 111 of npn-type element 83. Further, first metal wiring 131 serves both as an input terminal of starting element and an input terminal of npn-type element 83. By leading out collector potential to the outside of semiconductor substrate (chip) by means of double layered structure of collector electrode wiring 121 and first metal wiring 131, first metal wiring 131 extending occupied area for connecting metal wires can be effectively disposed on the outermost surface, and therefore miniaturization of the semiconductor device can be promoted.

second metal wiring 132 is formed on source electrode wiring 123 and gate electrode wiring 124 so as to surround first metal wiring 131. Second metal wiring 132 is electrically connected to gate electrode wiring 124 through a via 135 penetrating second interlayer insulating film 108, and electrically connected to gate region 103 and gate polysilicon electrode 105. According to these connections, gate polysilicon electrode 105 is provided with the same potential as p-type substrate 100. Third metal wiring 133 is formed on source electrode wiring 123 and gate electrode wiring 124 so as to surround second metal wiring 132. Third metal wiring 133 is electrically connected to source electrode wiring 123 through a via 136 penetrating second interlayer insulating film 108, and electrically connected to source region 104. In FIG. 2, first via 134, second via 135 and third via 136 are shown by using rougher broken line than contact part of each wiring in lower stage.

Starting element of the constitution like this allots its task so that the junction between gate region 103 and drift region 102 is charge of the structure for high voltage strength, and source region 104 is charge of the structure for large electric current, and therefore high voltage strength can be compatible with reduction of on resistance. When voltage is applied to drain region 101, drain current flows radially. When source region 104 is biased to positive potential and this potential rises to be a certain potential, drift region 102 is cut off by depletion layer and drain current is shut off.

Figure 5:
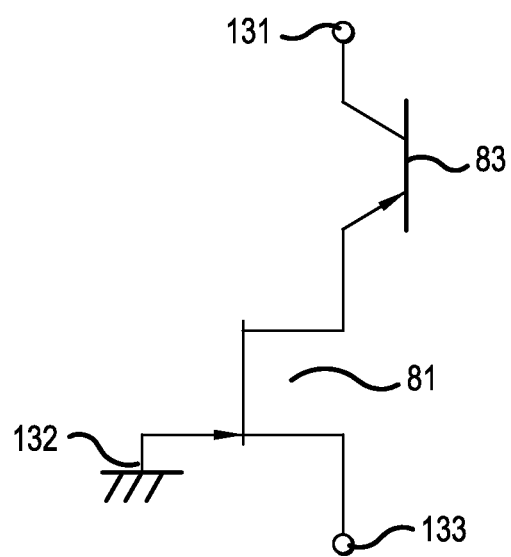
FIG. 5 is a circuit diagram showing an equivalent circuit of semiconductor device related to a first embodiment.

Next, operations of semiconductor device are described related to a first embodiment. FIG. 5 is a circuit diagram showing equivalent circuit of semiconductor device related to a first embodiment. FIG. 5 indicates connection points of first metal wiring 131, second metal wiring 132 and third metal wiring 133 by terminal symbols. In semiconductor device (starting element) related to the above-mentioned first embodiment, when input voltage is applied to first metal wiring 131, current flowing through drain region 101 passes through drift region 102 and source region 104, through a route from source electrode wiring 123 to third metal wiring 133, and then flows to post-stage circuit part connected to third metal wiring 133. This supplies starting current to post-stage circuit of starting circuit. As shown in FIG. 5, this starting element has circuit constitution connecting npn-type element 83 to JFET 81 in series, between input terminal (first metal wiring 131) and JFET 81.

When input voltage is applied to first metal wiring 131, current flowing through JFET 81 changes with npn-type element 83 disposed in high potential side (pre-stage) of JFET 81. By using this current change, input voltage detection is implemented. Specifically, when npn-type element 83 disposed in high voltage side of JFET 81 does not turn to conductive state, current does not be supplied to JFET 81. Thus breakdown beginning voltage is defined as maximum value of prescribed voltage detected by npn-type element 83 (hereinafter referred to as "detection threshold voltage"), and npn-type element 83 is designed so as to prevent punch through in lower voltage than detection threshold voltage. Breakdown voltage of npn-type element 83 is changed into input voltage detecting level (for example, collector-emitter voltage VBceo is equal to about 80V).

Since npn-type element 83 is connected to drain of JFET 81 in series, current flowing through JFET 81 by input voltage applied to input terminal is micro current of reversing saturated current level, until npn-type element 83 has a breakdown (when input voltage is less than detection threshold voltage). On the other hand, when input voltage applied to input terminal is not less than breakdown beginning voltage of npn-type element 83 (that is, input voltage is not less than detection threshold voltage), current flowing through JFET 81 increases sharply by conduction of npn-type element 83. Thus current through JFET 81 turns to current quantity flowing essentially through JFET 81 when providing no npn-type element 83, and therefore JFET 81 can be made to operate almost as usual. Accordingly, by detecting that current through JFET 81 is micro current, input voltage drop is detected, and then supplying starting current could be stopped to post-stage circuit part of starting circuit.

That is, when input voltage is lower than operating voltage of control IC (input-voltage detecting level), supplying starting current is stopped to post-stage circuit part of starting circuit, on the ground that npn-type element 83 prevents JFET 81 from operating. This enables brown-out protection function to be realized, for example, by BO comparator of post-stage circuit part of starting circuit. Therefore, when input voltage of usual operating voltage level of control IC is applied, various conditions of npn-type element 83 could be established so as to provide a state possible to supply starting current to post-stage circuit part of starting circuit (that is, conductive state). Various conditions of npn-type element 83 include for example dimension and impurity concentration of p-type region 110, collector region 111 and emitter region 112 constituting npn-type element 83.

Figure 6:
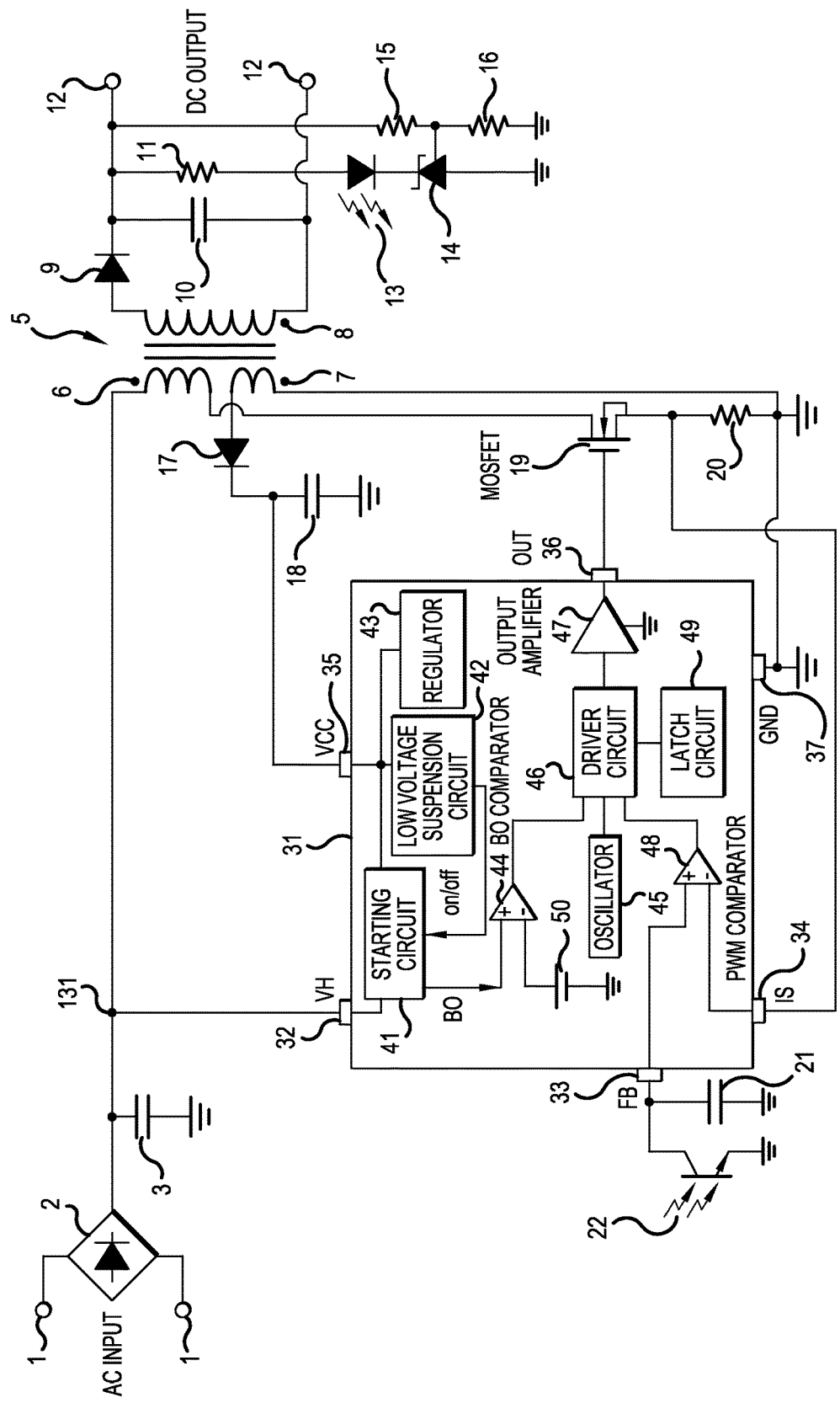
FIG. 6 is a circuit diagram showing a configuration example of switching power supply unit related to a first embodiment of the invention.

Next, constitution of switching power supply unit related to a first embodiment is described. FIG. 6 is a circuit diagram showing an example of constitution of switching power supply unit related to the first embodiment of the invention. Switching power supply unit related to the first embodiment shown in FIG. 6 is made so as to rectify AC input smoothly and supply it to VH terminal 32 of control IC 31. Control IC 31 contains the above-mentioned starting element (not illustrated) in starting circuit 41. That is, starting element in starting circuit 41 includes npn-type element for detecting AC input drop (see FIG. 7).

Control IC 31 has VH terminal 32 such as 500V level, feedback input terminal (hereinafter referred to as "FB terminal") 33, current sense input terminal (hereinafter referred to as "IS terminal") 34, power supply voltage terminal (hereinafter referred to as "VCC terminal") 35, gate drive terminal (hereinafter referred to as "OUT terminal") 36 of MOSFET 19, and ground terminal (hereinafter referred to as "GND terminal") 37. VH terminal 32 supplies current to VCC terminal 35 when starting power supply. For example, voltage rectifying AC input voltage smoothly is applied to VH terminal 32. GND terminal 37 is grounded.

AC input is supplied to rectifier 2 through AC input terminal 1. Rectifier 2 is connected to AC input terminal 1 to full-wave rectify AC input. Power supply capacitor 3 is connected to output terminal in parallel to be charged by DC voltage outputted from rectifier 2. Charged power supply capacitor 3 becomes DC power source supplying DC voltage to primary coil 6 of transformer 5. Also, VH terminal 32 of control IC 31 is connected to power supply capacitor 3. Connection with output terminal of rectifier 2 and VH terminal 32 of control IC 31 corresponds to terminal connection of high potential side in FIG. 5 (that is, connection point of first metal wiring 131 in FIG. 5).

Primary coil 6 is connected between power supply capacitor 3 and drain terminal of MOSFET 19 functioning as switching element. Source terminal of MOSFET 19 is connected to IS terminal 34 of control IC 31 and one end of resistor 20. The other end of resistor 20 is grounded. By the resistor 20, current flowing through MOSFET 19 is converted to voltage, which is applied to IS terminal 34. Gate terminal of MOSFET 19 is connected to OUT terminal 36 of control IC 31.

One end of auxiliary coil 7 of transformer 5 is connected to anode terminal of rectifier diode 17 in parallel. The other end of auxiliary coil 7 is grounded. Current induced by switching operation of MOSFET 19 flows in auxiliary coil 7. Rectifier diode 17 rectifies current flowing through auxiliary coil 7 to charge smoothing capacitor 18 connected to cathode terminal thereof. Smoothing capacitor 18 is connected to VCC terminal 35 of control IC 31 to become direct-current power source for continuing switching operation of MOSFET 19.

In secondary coil 8 of transformer 5, the voltage is induced based on voltage of power supply capacitor 3 by switching operation of MOSFET 19. One end of secondary coil 8 is connected to anode terminal of rectifier diode 9. Cathode terminal of rectifier diode 9 and the other end of secondary coil 8 are connected to DC output terminal 12. In addition, smoothing capacitor 10 is connected between cathode terminal of rectifier diode 9 and the other end of secondary coil 8. Rectifier diode 9 rectifies current flowing through secondary coil 8 to charge smoothing capacitor 10. Charged smoothing capacitor 10 supplies direct-current output (DC output) which is controlled so as to become desired direct-current voltage value for unillustrated load connected to DC output terminal 12.

Moreover, resistor-voltage dividing circuit consisting of two resistors 15, 16 and one end of resistor 11 are connected to anode terminal of rectifier diode 9 and connection node of DC output terminal 12. The other end of resistor 11 is connected to anode terminal of photodiode 13 composing photocoupler. Cathode terminal of photodiode 13 is connected to cathode terminal of shunt regulator 14. Anode terminal of shunt regulator 14 is grounded. These resistors 11, 15 and 16, photodiode 13, and shunt regulator 14 constitute voltage-detecting/feedback circuit which detects direct-current output voltage of both ends of smoothing capacitor 10 and adjusts this direct-current output voltage.

Light signal is outputted from photodiode 13, so as to adjust direct-current output voltage of both ends of smoothing capacitor 10 to prescribed direct-current voltage value, based on predetermined value of shunt regulator 14. The light signal is received by phototransistor 22 composing photocoupler together with photodiode 13 to turn feedback signal to control IC 31. Phototransistor 22 is connected to FB terminal 33 of control IC 31 and feedback signal is inputted to this FB terminal 33. Further, capacitor 21 is connected to phototransistor 22. This capacitor 21 becomes noise filter against feedback signal.

Control IC 31 includes starting circuit 41, low voltage suspension circuit (UVLO: Under-Voltage-Lock-Out) 42, regulator 43, BO comparator 44, oscillator 45, driver circuit 46, output amplifier 47, pulse-width modulation comparator (hereinafter referred to as "PWM comparator") 48, latch circuit 49, and reference power supply 50. Starting circuit 41 is connected to VH terminal 32, VCC terminal 35, and non-inverting input terminal of BO comparator 44. Starting circuit 41 provides current for VCC terminal 35 when starting power supply.

Low voltage suspension circuit 42 is connected to VCC terminal 35 and starting circuit 41. When voltage of VCC terminal 35 rises up to required voltage for operation of control IC 31 through current supplied by starting circuit 41, low voltage suspension circuit 42 makes current supply from starting circuit 41 to VCC terminal 35 suspended. After that, current supply to VCC terminal 35 is provided through auxiliary coil 7. Regulator 43 is connected to VCC terminal 35, and generates reference voltage required for operating respective parts of control IC 31. After starting power supply, control IC 31 is driven by reference voltage to be outputted through regulator 43.

Inverting input terminal and non-inverting input terminal of PWM comparator 48 are connected to IS terminal 34 and FB terminal 33, respectively. PWM comparator 48 inverts output according to magnitude relation between inverting input terminal voltage and non-inverting input terminal voltage. Output of PWM comparator 48 is inputted to driver circuit 46.

Oscillator 45 is connected to driver circuit 46, to which oscillation signal is inputted from oscillator 45. When turn-on signal is inputted from oscillator 45 to driver circuit 46 and further non-inverting input terminal voltage of PWM comparator 48 (that is, voltage of FB terminal 33) is larger than inverting input terminal voltage (that is, voltage of IS terminal 34), output signal of driver circuit 46 turns Hi-state. Output amplifier 47 amplifies Hi-state signal outputted from driver circuit 46 to drive gate of MOSFET 19 via OUT terminal 36.

On the other hand, when inverting input terminal voltage of PWM comparator 48 is larger than non-inverting input terminal voltage, PWM comparator 48 is inverted, and then output signal of driver circuit 46 turns Low-state. Output amplifier 47 amplifies Low-state signal outputted from driver circuit 46 to supply it to gate of MOSFET 19 via OUT terminal 36. Accordingly, MOSFET 19 turns Off-state and consequently no current flows to MOSFET 19. Thus by changing threshold level of PWM comparator 48 in response to secondary side of output voltage and variably controlling on period of MOSFET 19, secondary side of output voltage gets stabilized.

In addition, inverting input terminal of BO comparator 44 is connected to reference power supply 50. BO comparator 44 inverts output according to magnitude relation between non-inverting input terminal voltage and inverting input terminal voltage. Voltage signal of BO terminal in starting circuit 41 is inputted to BO comparator 44 as mentioned below. Output of BO comparator 44 is inputted to driver circuit 46.

When non-inverting input terminal voltage of BO comparator 44 is larger than inverting input terminal with Hi-state signal outputted from driver circuit 46, output signal of driver circuit 46 remains Hi-state. When primary side of input voltage decreases by suspending voltage supply from AC input, non-inverting input terminal voltage of BO comparator 44 gets smaller than inverting input terminal voltage. Then, input signal of driver circuit 46 is inverted to Low-state, switching operation of MOSFET 19 stops, and brown-out function becomes to work.

Latch circuit 49 is connected to driver circuit 46. When detecting anomalous conditions including voltage elevation of secondary side output, heat generation of control IC 31, or voltage drop of secondary side output, latch circuit 49 changes output of driver circuit 46 into forced Low-state and stops electric power supply to secondary side output, for the purpose of overvoltage protection, overheat protection, or overcurrent protection. This condition is held until VCC power supply voltage decreases and control IC 31 is reset. Especially not exclusively, for example, elements constituting each circuit of control IC 31 are integrated on the identical semiconductor substrate.

Figure 7:
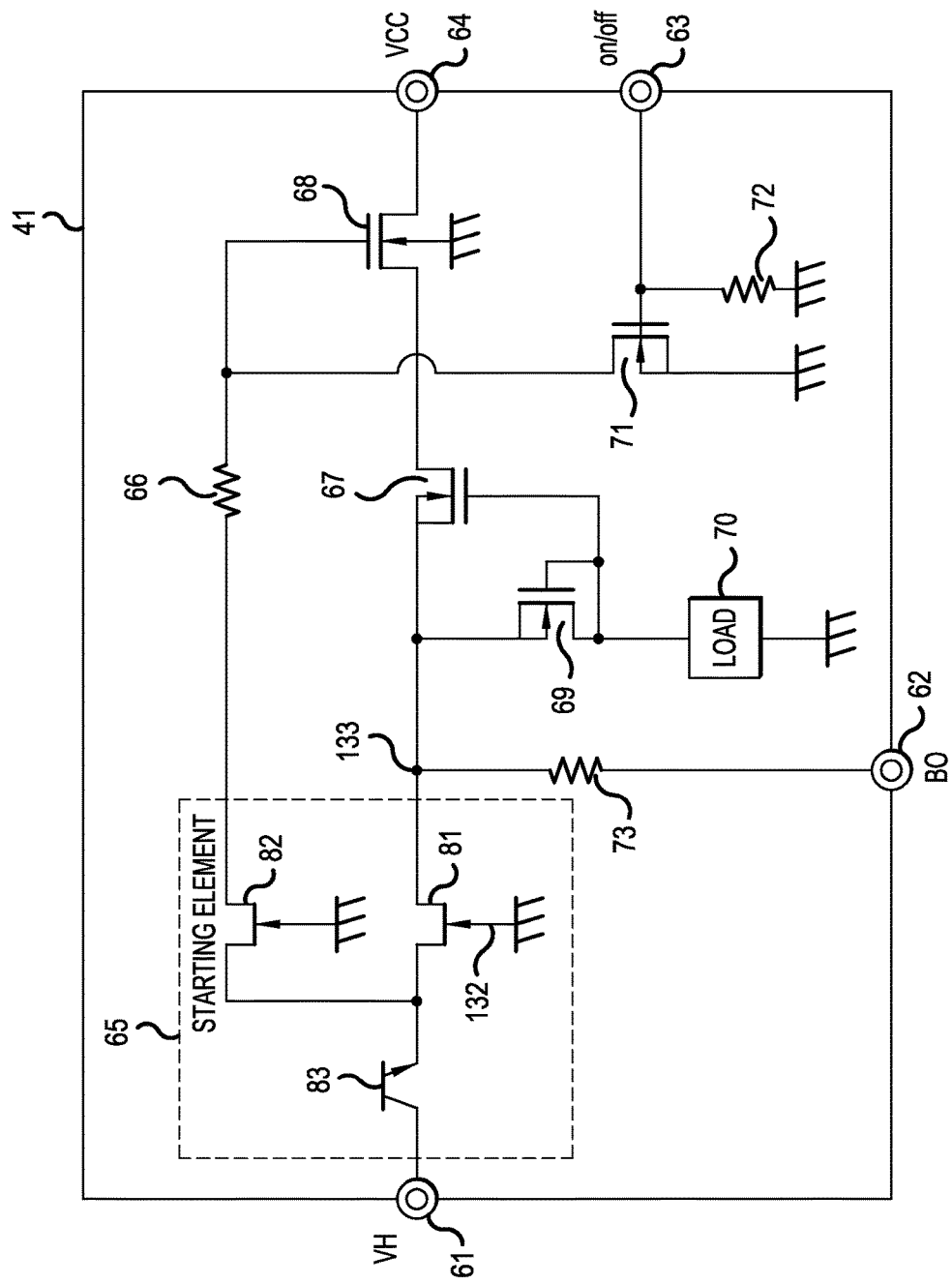
FIG. 7 is a circuit diagram showing a configuration example of starting circuit in FIG. 6.

FIG. 7 is a circuit diagram showing an example of starting circuit configuration in FIG. 6. As shown in FIG. 7, starting circuit 41 includes VH terminal (high breakdown voltage input terminal) 61, BO terminal 62, on/off terminal (on/off signal input terminal) 63, and VCC terminal (power supply voltage terminal) 64. VH terminal 61 and VCC terminal 64 are connected to VH terminal 32 and VCC terminal 35 of control IC 31, respectively. On/off terminal 63 is connected to low voltage suspension circuit 42.

In addition, starting circuit 41 includes starting element 65. Starting element 65 includes two high breakdown voltage JFETs (hereinafter referred to as "first JFET and second JFET") 81 and 82, and npn-type element 83. First JFET 81 and second JFET 82 is normally-on type field effect junction transistor and their gate terminals are grounded. Further, drain terminals of first JFET 81 and second JFET 82 are connected in common to emitter terminal of npn-type element 83. Collector terminal of npn-type element 83 is connected to VH terminal 61.

BO terminal 62 is connected to source terminal of first JFET 81 through resistor 73. Connection point with source terminal of first JFET 81 and resistor 73 corresponds to connection point of low potential side terminal in FIG. 5 (that is, connection place of third metal wiring 133 in FIG. 5). In addition, BO terminal 62 is connected to non-inverting input terminal of BO comparator 44. That is, input voltage to VH terminal 6 is inputted to non-inverting input terminal of BO comparator 44 when it is more than detection threshold voltage by npn-type element 83. Voltage applied to VCC terminal 64 is about 100V for example and voltage applied to BO terminal 62 is about 20V for example.

Further, source terminal of first JFET 81 is connected to source terminal of first PMOS transistor 67 and source terminal of second PMOS transistor 69. Gate terminal of first PMOS transistor 67 is connected in common to both gate terminal and drain terminal of second PMOS transistor 69. Drain terminal of second PMOS terminal 69 is connected to load 70. First NMOS transistor 68 is connected between drain terminal of first PMOS transistor 67 and VCC terminal 64.

Gate terminal of first NMOS transistor 68 is connected to source terminal of second JFET 82 through resistor 66. Further, gate terminal of first NMOS transistor 68 is connected to drain terminal of second NMOS transistor 71. Gate terminal of second NMOS transistor 71 is connected to on/off terminal 63. Source terminal of second NMOS transistor 71 is grounded. Further, gate terminal of second NMOS transistor 71 is grounded through resistor 72.

In starting circuit 41 thus constituted, current flowing in second PMOS transistor 69 is decided by voltage-current characteristics of second PMOS transistor 69 and impedance of load 70. Second PMOS transistor 69 and first PMOS transistor 67 are current-mirror connected. First NMOS transistor 68 functions as a switch changing over between on-state and off-state, based on on/off signal supplied from low voltage suspension circuit 42 through on/off terminal 63.

When on/off signal has Low-state, second NMOS transistor 71 turns off-state, and switch gets on-state because high voltage is inputted to gate terminal of first NMOS transistor 68. By that this switch gets on-state, current is supplied from starting circuit 41 to VCC terminal 35 of control IC 31 when starting power supply mentioned above.

On the other hand, when on/off signal has Hi-state, second NMOS transistor 71 turns on-state, and the switch gets off-state because gate voltage of first NMOS transistor 68 reaches zero. Accordingly, current path is cut off between VN terminal 61 and VCC terminal 64, and therefore current supply stops from starting circuit 41 to VCC terminal 35.

First JFET 81 and second JFET 82 may be also composed of one JFET. For example, when composed of first JFET 81 only, second JFET 82 comes into disuse, and then wiring connected to source terminal of second JFET 82 and connected to resistor 66 could be connected to source terminal of first JFET 81.

As explained above, according to the first embodiment, input voltage drop can be detected without using resistor-voltage dividing circuit, by designing that npn-type element is connected in series between input terminal of starting circuit and drain of starting element and does not flow current at input voltage less than prescribed voltage. This can reduce electric power loss due to current consumption of resistor-voltage dividing circuit, and simultaneously eliminate variation of resistivity generated when constituting resistor-voltage dividing circuit of high resistance with resistor, and consequently eliminate detecting variation of input voltage caused by resistivity variation.

Further, according to the first embodiment, circuit constitution can be simplified because it is not necessary to add adjusting circuit such as trimming in order to solve problems caused by constituting high resistant resistor-voltage dividing circuit with resistor. In addition, according to the first embodiment, control IC containing input voltage detecting means is obtained, because npn-type element of input voltage detecting means is integrated in the identical semiconductor substrate with starting element. Therefore, reduction of parts count externally added to control IC can result in the cost reduction of parts and assembly and the miniaturization.

Second Embodiment

Figure 8:
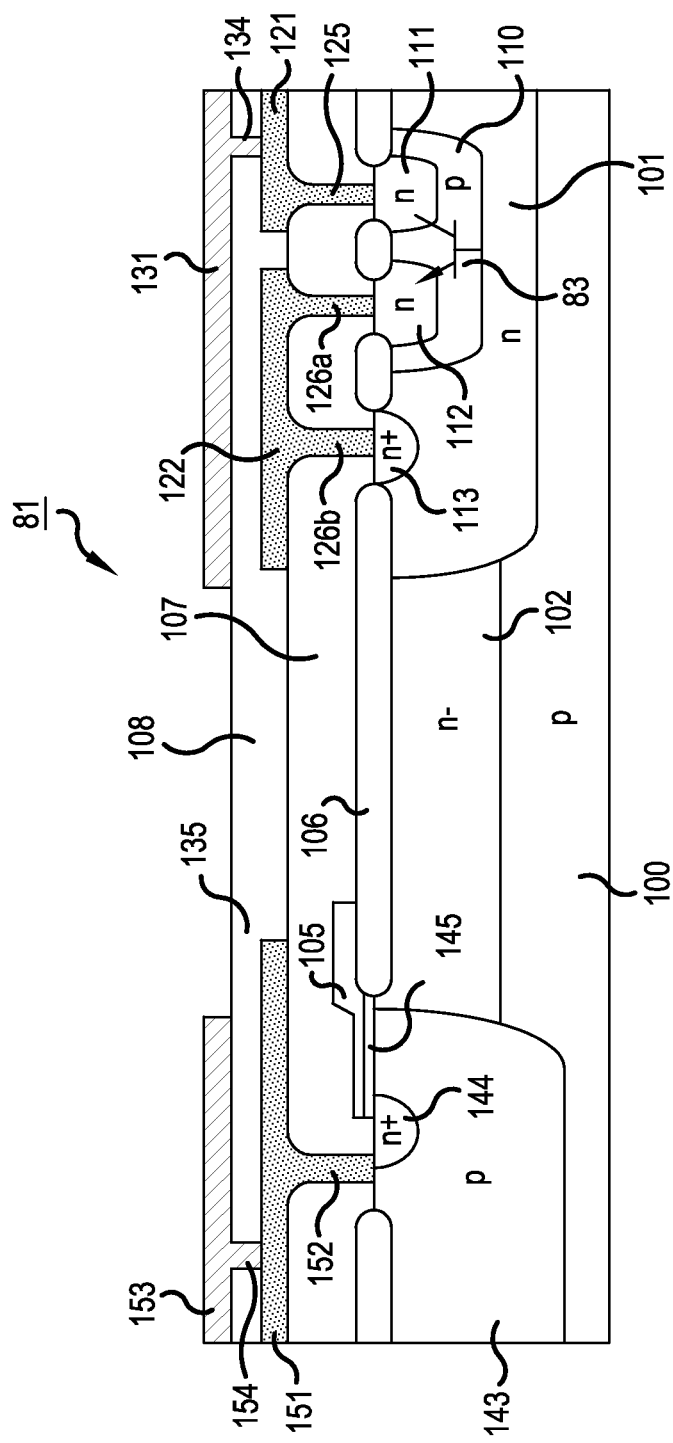
FIG. 8 is a cross-sectional view showing semiconductor device related to a second embodiment of the invention.

Next, Configuration of semiconductor device related to a second embodiment will be described. FIG. 8 is a cross-sectional view of semiconductor device related to the second embodiment. As shown in FIG. 8, semiconductor related to the second embodiment is composed of starting element 65 consisting of two high breakdown voltage field effect transistors, which are composed of n-channel insulated gate type transistor (NMOSFET) in substitution for junction type transistor (JFET 81 and JFET 82 of the first embodiment). With reference to FIG. 8 below, description will be given only that semiconductor device related to the second embodiment differs from semiconductor device related to the first embodiment.

P-type well region as gate region in JFET of the first embodiment becomes p-type base region 143 in NMOSFET of the second embodiment. The p-type base region 143 becomes channel region wherein channel is formed. Source region 144 is provided on the circumference spaced equally apart from drain region 101, with planar shape in a circle, in the surface layer of p-type substrate 100 in p-type base region 143. That is, source region 144 is provided as continuous single region.

Accordingly, in semiconductor device related to the first embodiment, source region 104 appears in cross-section shown in FIG. 3 and source region 104 does not appear in cross-section shown in FIG. 4, while in semiconductor device related to the second embodiment, p-type base region 143 and source region 144 therein appear in every cross-section. Source region 144 and $n^+$-type high concentration region 113 inside of drain region 101 are simultaneously formed by diffusion process for example. The depth of source region 144 and $n^+$-type high concentration region 113 is smaller than that of drift region 102 and p-type base region 143. Moreover, $n^+$-type high concentration region 113 need not always be provided.

In addition, p-type base region 143 is in contact with drift region 102. On the surface of p-type base region 143 sandwiched between drift region 102 and source region 144, gate polysilicon electrode 105 of control electrode is provided through gate insulating film 145. Gate polysilicon electrode 105 is led out on the surface of first interlayer insulating film 107 and second interlayer insulating film 108 in the cross section different from FIG. 8, and is connected to gate electrode wiring not shown in the drawing. Metal wiring used as source electrode wiring (third electrode wiring) 151 is electrically connected to both p-type base region 143 and source region 144 through source contact part 152 penetrating first interlayer insulating film 107.

Third metal wiring (third electrode wiring) 153 is electrically connected to source electrode wiring 151 through a via 154 penetrating second interlayer insulating film 108, and electrically connected to p-type base region 143 and source region 144. When a plurality of JFETs (for example, first JFET 81 and second JFET 82) is provided on the identical semiconductor substrate, source electrode wiring 151 is divided into plurality. The reason is that dividing source electrode wiring 151 makes source region 144 consisting of continuous single region into respective source regions of NMOSFET corresponding to first JFET 81 and NMOSFET corresponding to second JFET 82.

As described above, the second embodiment can provide the same effectiveness as the first embodiment.

Example of Embodiment

Figure 9:
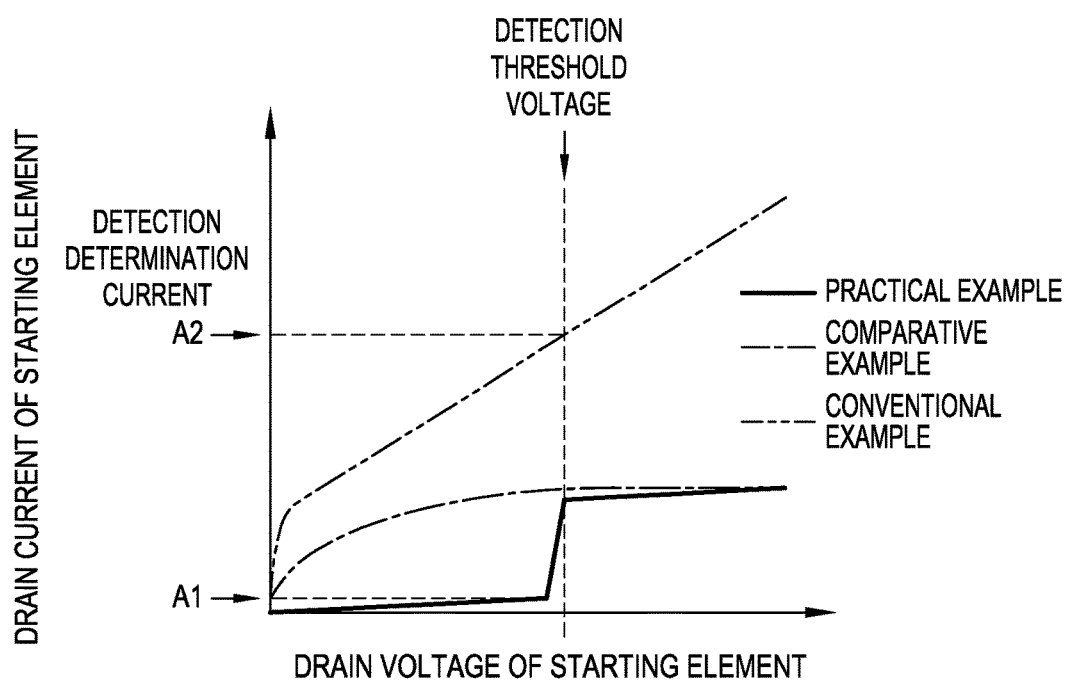
FIG. 9 is a characteristic diagram showing voltage-current characteristics for semiconductor device related to the present invention.

Next, voltage-current characteristic of starting element is explained including npn-type element related to the present invention. FIG. 9 is a diagram showing voltage-current characteristic of semiconductor device related to the present invention. FIG. 9 shows a result with a solid line to verify voltage-current characteristic (relation between drain voltage and drain current) of semiconductor device related to the first embodiment (hereinafter referred to as "practical example"). Specifically, functions as input voltage detecting means of npn-type element 83 included in practical example (starting element) were verified. FIG. 9 shows voltage-current characteristic of single starting element not including input voltage detecting means (hereinafter referred to as "comparative example") by using dot and dash line, and voltage-current characteristic of starting element of the above document 1 including resistor-voltage dividing circuit as input voltage detecting means (hereinafter referred to as "conventional example") by using two-dot chain line.

According to the result shown in FIG. 9, it was confirmed in practical example that in operating region applied with drain voltage (operating voltage) not less than detection threshold voltage by npn-type element 83, starting element operates in a nearly similar way to comparative example, whereas in case of drain voltage less than detection threshold voltage, drain current hardly flows and starting element does not operate. On the other hand, in comparative example, even in case of drain voltage less than detection threshold voltage, drain current flows and starting element is operated. That is, in practical example, it was confirmed that using npn-type element 83 can detect input voltage drop and realize brown-out protecting function. In addition, detection determining current value A1 by using npn-type element 83 of practical example is drastically smaller than detection determining current value A2 by using resistor-voltage dividing current of conventional example, and therefore it was confirmed that practical example can bring more reduction of current consumption than conventional example.

In the above description, the present invention makes various changes possible, not limited to the above-mentioned embodiments. For example, in each embodiment, starting element including field effect transistor such as JFET or MOSFET was explained as an example, however substitution for field effect transistor may use element depleting drift region completely when voltage of drift region is elevated, or transistor (switch) of which resistance value changes in response to input voltage value. Further, in each embodiment, control IC of switching power supply unit was explained as an example, however not limited to this, the present invention is applicable to various integrated circuit constituted by using functions that electric current does not flow in case of input voltage less than prescribed voltage (not operating), or that electric current flows in case of input voltage not less than prescribed voltage (operating). Also in each embodiment, starting element has planar shape in circle, but starting element may have planar shape with track shape for example. Further, described values in embodiments are a single example, and therefore the present invention is not limited to their values. In addition, in description for semiconductor device, first conductivity type was used as p-type and second conductivity type was used as n-type, however it is effected in the present invention as well that first conductivity type is used as n-type and second conductivity type is used as p-type.

As mentioned above, semiconductor device, control IC for switching power supply, and switching power supply unit related to the present invention are useful to power semiconductor devices used for electric power transformer such as invertors and power supply unit such as various industrial machines.

What is claimed is:

1. A semiconductor device comprising:
    a field effect transistor including a drift region of a second conductivity type formed in a surface layer of a semiconductor substrate of a first conductivity type, and a drain region of the second conductivity type, formed in the surface layer of the semiconductor substrate, and in contact with the drift region;
    a semiconductor region of the first conductivity type selectively formed in a surface layer of the drain region;
    a first semiconductor region of the second conductivity type selectively formed in a surface layer of the semiconductor region of the first conductivity type;
    a second semiconductor region of the second conductivity type selectively formed in the surface layer of the semiconductor region of the first conductivity type, apart from the first semiconductor region of the second conductivity type;
    a first electric wiring electrically connected to the first semiconductor region of the second conductivity type, and configured to receive an externally inputted input voltage; and
    a second electric wiring electrically connected to the drain region and the second semiconductor region of the second conductivity type,
    wherein the first electric wiring and the second electric wiring are not directly electrically connected.

2. The semiconductor device according to claim 1, wherein the field effect transistor includes a gate region of a first conductivity type selectively formed in a surface layer of the semiconductor substrate in contact with the drift region, the semiconductor device further comprising:
    a source region of a second conductivity type formed in a surface layer of the semiconductor substrate in contact with the channel region, facing the drain region across the drift region;
    a control electrode connected to the channel region;
    a third electrode wiring connected to the source region; and
    a fourth electrode wiring connected to the channel region and the control electrode.

3. The semiconductor device according to claim 1, wherein the field effect transistor includes a channel region of a first conductivity type selectively formed in a surface layer of the semiconductor substrate in contact with the drift region, facing the drain region across the drift region, the semiconductor device further comprising:
- a source region of a second conductivity type selectively formed in a surface layer of the channel region;
- a control electrode formed in a surface of a portion of the channel region through an insulating film, the portion sandwiched between the drift region and the source region; and
- a third electrode wiring connected to the channel region and the source region.

4. A control IC for a switching power supply comprising:
a starting circuit, wherein
the starting circuit includes the semiconductor device according to claim 3.

5. A control IC for a switching power supply comprising:
a starting circuit, wherein
the starting circuit includes the semiconductor device according to claim 1.

6. A switching power supply unit having the control IC for the switching power supply according to claim 5.

7. A control IC for a switching power supply comprising, a starting circuit including:
- a field effect transistor configured to receive an externally applied primary side voltage to a drain terminal, the field effect transistor being grounded with a gate terminal, and outputting a signal for controlling a switching transistor through a source terminal; and
- a bipolar transistor integrated in the same semiconductor substrate as the field effect transistor and in a drain region of the field effect transistor,
- wherein the bipolar transistor conducts when the primary side voltage is at or above the breakdown initiation voltage, and the field effect transistor operates as a result of said conducting of the bipolar transistor, and
- wherein a base region of the bipolar transistor is not directly connected to an input voltage terminal of the starting circuit.

8. A switching power supply unit having the control IC for the switching power supply according to claim 7.

9. The control IC according to claim 7, wherein the field effect transistor is a JFET, the control IC further comprising a gate electrode for connecting to a ground potential.

10. A semiconductor device comprising:
a field effect transistor including a drift region of a second conductivity type formed in a surface layer of a semiconductor substrate of a first conductivity type, and a drain region of the second conductivity type, formed in a the surface layer of the semiconductor substrate, and in contact with the drift region;
a semiconductor region of the first conductivity type selectively formed in a surface layer of the drain region;
a first semiconductor region of the second conductivity type selectively formed in a surface layer of the semiconductor region of the first conductivity type;
a second semiconductor region of the second conductivity type selectively formed in the surface layer of the semiconductor region of the first conductivity type, apart from the first semiconductor region of the second conductivity type;
a first electric wiring electrically connected to the first semiconductor region of the second conductivity type, and configured to receive an externally inputted input voltage; and
a second electric wiring electrically connected to the drain region and the second semiconductor region of the second conductivity type;
the field effect transistor further including a gate region of the first conductivity type selectively formed in a surface layer of the semiconductor substrate in contact with the drift region,
the semiconductor device further comprising:
a source region of the second conductivity type formed in a surface layer of the semiconductor substrate in contact with a channel region, facing the drain region across the drift region;
a control electrode electrically connected to the channel region;
a third electrode wiring electrically connected to the source region; and
a fourth electrode wiring electrically connected to the channel region and the control electrode.

* * * * *